(12) United States Patent
Xie et al.

(10) Patent No.: US 11,302,892 B2
(45) Date of Patent: Apr. 12, 2022

(54) DISPLAY SUBSTRATE AND MANUFACTURE METHOD THEREOF, AND DISPLAY DEVICE

(71) Applicant: BOE TECHNOLOGY GROUP CO., LTD., Beijing (CN)

(72) Inventors: Chunyan Xie, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 251 days.

(21) Appl. No.: 16/604,304

(22) PCT Filed: Nov. 23, 2018

(86) PCT No.: PCT/CN2018/117123
§ 371 (c)(1),
(2) Date: Oct. 10, 2019

(87) PCT Pub. No.: WO2020/103119
PCT Pub. Date: May 28, 2020

(65) Prior Publication Data
US 2021/0343981 A1   Nov. 4, 2021

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3246* (2013.01); *H01L 51/56* (2013.01); *H01L 2227/323* (2013.01)

(58) Field of Classification Search
CPC . H01L 51/5253; H01L 51/56; H01L 27/3246; H01L 2227/323
See application file for complete search history.

(56) References Cited

U.S. PATENT DOCUMENTS

| 9,632,487 B2 | 4/2017 | Kim et al. |
| 10,224,508 B2 | 3/2019 | Cai et al. |
| 2019/0214596 A1* | 7/2019 | Park ............... G06F 3/0412 |

(Continued)

FOREIGN PATENT DOCUMENTS

| CN | 106409867 A | 2/2017 |
| CN | 107808896 A | 3/2018 |
| CN | 108649133 A | 10/2018 |

*Primary Examiner* — Shaun M Campbell
(74) *Attorney, Agent, or Firm* — Dilworth & Barrese, LLP.; Michael J. Musella, Esq.

(57) ABSTRACT

A display substrate and a manufacture method thereof, and a display device are provided. The display substrate includes a display region, the display region includes an organic functional layer, an encapsulation layer, and a first barrier wall; the display region has a first opening, the first barrier wall surrounds an outer edge of the first opening, the organic functional layer surrounds the first barrier wall, and the encapsulation layer covers the organic functional layer and the first barrier wall; the encapsulation layer includes a first portion and a second portion, the first portion is configured to cover a portion of the organic functional layer close to the first opening; a second portion is configured to cover a side of the first barrier wall adjacent to the organic functional layer, the first portion forms an obtuse angle with the second portion.

19 Claims, 8 Drawing Sheets

(56) References Cited

U.S. PATENT DOCUMENTS

2020/0075692 A1*　3/2020　Park ................... H01L 51/5253
2020/0127233 A1*　4/2020　Sung ................ H01L 21/76205
2021/0234125 A1*　7/2021　Sung ...................... H01L 27/32

* cited by examiner

DISPLAY SUBSTRATE AND MANUFACTURE METHOD THEREOF, AND DISPLAY DEVICE

TECHNICAL FIELD

The embodiments of the present disclosure relate to a display substrate and a manufacture method thereof, and a display device.

BACKGROUND

Currently, a display screen of a display device is developing toward a large screen and a full screen. Generally, the display device (such as a mobile phone, a tablet, etc.) has a camera device (or an imaging device), and the camera device is usually disposed on a side of the display screen outside a display region of the display screen. However, because the installation of the camera device requires a certain position, it is not conducive to the design of the full screen and narrow border of the display screen. For example, the camera device can be combined with the display region of the display screen, and a position is reserved for the camera device in the display region, so as to maximize the display region of the display screen.

SUMMARY

At least one embodiment of the present disclosure provides a display substrate, and the display substrate comprises a display region, the display region comprises an organic functional layer, an encapsulation layer, and a first barrier wall; the display region has a first opening, the first barrier wall surrounds an outer edge of the first opening, the organic functional layer surrounds the first barrier wall, and the encapsulation layer covers the organic functional layer and the first barrier wall; the encapsulation layer comprises a first portion and a second portion, the first portion is configured to cover a portion of the organic functional layer close to the first opening; the second portion is configured to cover a side of the first barrier wall adjacent to the organic functional layer, and the first portion forms an obtuse angle with the second portion.

For example, in the display substrate provided by at least one embodiment of the present disclosure, the first barrier wall comprises a first barrier wall layer and a second barrier wall layer stacked on the first barrier wall layer; a first side, which is covered by the encapsulation layer, of the first barrier wall layer forms an acute angle with a bottom surface of the first barrier wall layer; and a second side, which is covered by the encapsulation layer, of the second barrier wall layer forms an obtuse angle with a bottom surface of the second barrier wall layer.

For example, in the display substrate provided by at least one embodiment of the present disclosure, the second side of the second barrier wall layer terminates at a top surface of the first barrier wall layer, so that the first side of the first barrier wall layer and the second side of the second barrier wall layer intersect or are staggered from each other.

For example, in the display substrate provided by at least one embodiment of the present disclosure, a main cross-section of the first barrier wall layer as a whole is in a positive trapezoid shape; and a main cross-section of the second barrier wall layer as a whole is in an inverted trapezoid shape.

For example, in the display substrate provided by at least one embodiment of the present disclosure, a width of a bottom edge of the inverted trapezoid shape is less than or equal to a width of a top edge of the positive trapezoid shape.

For example, in the display substrate provided by at least one embodiment of the present disclosure, the second portion of the encapsulation layer comprises: a third portion of the encapsulation layer covering the first barrier wall layer, and a fourth portion of the encapsulation layer covering the second barrier wall layer; the first portion forms a first obtuse angle with the third portion, and the third portion forms a second obtuse angle with the fourth portion.

For example, in the display substrate provided by at least one embodiment of the present disclosure, a material of the second barrier wall layer comprises a negative photoresist.

For example, in the display substrate provided by at least one embodiment of the present disclosure, the negative photoresist comprises a phenolic resin.

For example, in the display substrate provided by at least one embodiment of the present disclosure, a material of the first barrier wall layer comprises a positive photoresist.

For example, in the display substrate provided by at least one embodiment of the present disclosure, the display region further comprises a second barrier wall, and the second barrier wall is disposed on a side of the first barrier wall away from the first opening and surrounding the first opening.

For example, the display substrate provided by at least one embodiment of the present disclosure further comprises a base substrate and an image sensor, the display region is on the base substrate, the base substrate has a second opening that is connected with the first opening, the image sensor is connected to the base substrate, and an orthographic projection of the image sensor on the base substrate at least partially overlaps with the second opening.

For example, in the display substrate provided by at least one embodiment of the present disclosure, the first opening and/or the second opening are filled with a transparent medium.

For example, in the display substrate provided by at least one embodiment of the present disclosure, the encapsulation layer is a composite encapsulation layer comprising an inorganic encapsulation layer and an organic encapsulation layer, in which the inorganic encapsulation layer and the organic encapsulation layer are stacked with each other.

At least one embodiment of the present disclosure provides a manufacture method of a display substrate, comprising: forming a display region, which comprises forming a first barrier wall, an organic functional layer, and an encapsulation layer, where the organic functional layer surrounds the first barrier wall, the encapsulation layer covers the organic functional layer and the first barrier wall, the encapsulation layer comprises a first portion and a second portion, the first portion is configured to cover the organic functional layer, the second portion is configured to cover a side of the first barrier wall adjacent to the organic functional layer, the first portion forms an obtuse angle with the second portion; and forming a first opening in a region surrounded by the first barrier wall.

For example, in the manufacture method provided by at least one embodiment of the present disclosure, the first opening is formed by a laser cutting method or a mechanical stamping method.

For example, in the manufacture method provided by at least one embodiment of the present disclosure, forming the first barrier wall comprises: forming a positive photoresist material layer, and exposing and developing the positive photoresist material layer to form a first barrier wall layer; and forming a negative photoresist material layer on the first barrier wall layer, and exposing and developing the negative photoresist material layer to form a second barrier wall layer.

For example, the manufacture method provided by at least one embodiment of the present disclosure further comprises forming a pixel defining layer, and the first barrier wall layer and the pixel defining layer are formed by a single patterning process.

For example, the manufacture method provided by at least one embodiment of the present disclosure further comprises forming a drive circuit layer and a planarization layer on the drive circuit layer, and the first barrier wall layer and the planarization layer are formed by a single patterning process.

For example, the manufacture method provided by at least one embodiment of the present disclosure further comprises forming a columnar spacer, and the second barrier wall layer and the columnar spacer are formed by a single patterning process.

At least one embodiment of the present disclosure provides a display device, and the display device comprises any one of the above display substrates.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to maximize a display region of a display device, a camera device (or an imaging device) of the display device can be integrated into the display region, and the camera device can be disposed in the display region.

Figure 1A:
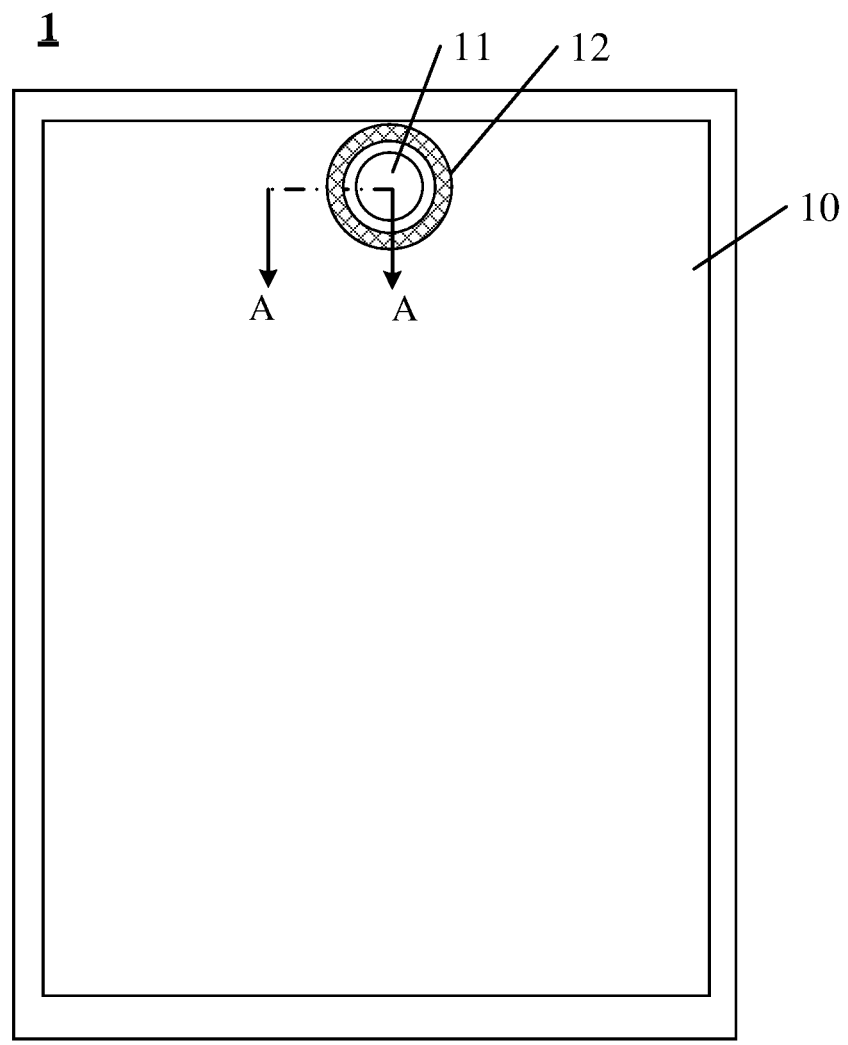
FIG. 1A is a schematic plane diagram of a display substrate.

For example, FIG. 1A is a schematic plane diagram of a display substrate for a display device. As shown in FIG. 1A, the display substrate 1 comprises a display region 10, the display region 10 comprises a pixel array and has an opening 11 in the pixel array, the opening 11 is a reserved position of the camera device (not shown), the camera device may be disposed on a back side of the display substrate opposite to a display side, so that the camera device can acquire an image through the opening 11. Therefore, the camera device is integrated into the display region 10 of the display substrate 1. Because the display region 10 is provided with the opening 11, a portion of the display region 100 located at an edge of the opening 11 needs to be sufficiently sealed, so as to prevent impurities such as water, oxygen, and the like from entering the inside of the display region 10 from the opening 11, and prevent the impurities from contaminating a functional material in the display region 10, and thereby preventing the impurities from affecting a display effect of the display region 10.

As shown in FIG. 1A, for example, a barrier 12 may be provided at the edge of the opening 11, the barrier 12 may, for example, surround the opening 11, and the display region 10 is sealed on the basis of the barrier 12, so as to enhance the encapsulation effect on the display region 10.

Figure 1B:
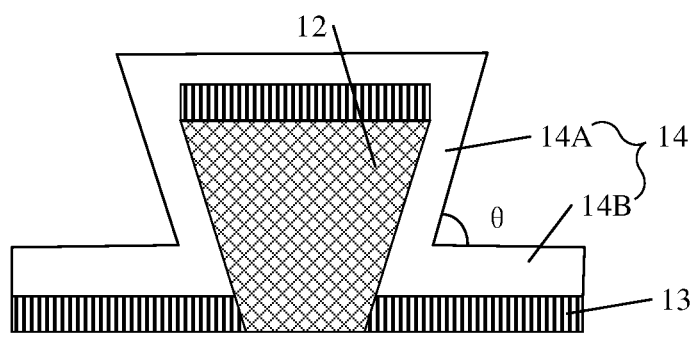
FIG. 1B is a partial cross-sectional schematic diagram of the display substrate shown in FIG. 1A along line A-A.

For example, FIG. 1B is a partial cross-sectional schematic diagram of the display substrate shown in FIG. 1A along line A-A. As shown in FIG. 1B, a cross section of the barrier 12 is usually formed in an inverted trapezoid shape, so that a functional material layer 13 formed after forming the barrier 12 can be disconnected. Because the functional material layer 13 is generally formed over an entire surface by a evaporation method, a sputtering method, an inkjet printing method, or the like, portions of the functional material layer 13 located in different regions need to be disconnected, so as to avoid interference generated by substances (especially impurities, such as water, oxygen, etc., which need to be avoided) exchange among different regions. For example, the functional material layer 13 comprises an organic layer, an electrode layer, and the like.

For example, as shown in FIG. 1B, the functional material layer 13 is disconnected by the barrier 12 to form three portions, that is, a first functional material portion on a left periphery of the barrier 12, a second functional material portion on a top surface of the barrier 12, and a third functional material portion on a right periphery of the barrier 12, as shown in the figure. For example, the first functional material portion on the left periphery of the barrier 12 corresponds to the pixel array; the third functional material portion on the right periphery of the barrier 12 is closer to the opening 11, and therefore the third functional material portion is most susceptible to contamination by impurities such as water and oxygen form a side wall of the opening 11, in this situation, the barrier 12 may disconnect the third functional material portion that may be contaminated and the first functional material portion that is closer to the inside of the display region 10, thereby preventing the impurities in the third functional material portion from diffusing and extending to the first functional material portion.

As shown in FIG. 1B, an encapsulation layer 14 formed on the barrier 12 is generally formed along an outer wall of the barrier 12, and therefore an encapsulation configuration of the encapsulation layer 14 is affected by a shape of the barrier 12. As shown in FIG. 1B, the encapsulation layer 14 is formed along the outer wall of the barrier 12 in the inverted trapezoid shape, on both sides of the barrier 12, a first encapsulation portion 14B of the encapsulation layer 14 covering the third functional material portion of the functional material layer 13 intersects a second encapsulation portion 14A of the encapsulation layer 14 covering the side of the barrier 12, so as to form an acute angle θ. The acute angle structure formed by the encapsulation layer 14 is prone to cracking in a case where a force is applied to the acute angle structure, so that the encapsulation layer 14 is damaged, which affects the encapsulation effect. For example, the impurities may infiltrate from the damage portion to affect the properties of the functional material layer 13 in the pixel array.

At least one embodiment of the present disclosure provides a display substrate, and the display substrate comprises a display region, the display region a comprises an organic functional layer, an encapsulation layer, and a first barrier wall; the display region has a first opening, the first barrier wall surrounds an outer edge of the first opening, the organic functional layer surrounds the first barrier wall, the encapsulation layer covers the organic functional layer and the first barrier wall; the encapsulation layer comprises a first portion and a second portion, the first portion is configured to cover a portion of the organic functional layer close to the first opening; the second portion is configured to cover a side of the first barrier wall adjacent to the organic functional layer, and the first portion forms an obtuse angle with the second portion.

At least one embodiment of the present disclosure provides a manufacture method of a display substrate, and the manufacture method comprises: forming a display region, which comprises forming a first barrier wall, an organic functional layer, and an encapsulation layer, the organic functional layer surrounds the first barrier wall, the encapsulation layer covers the organic functional layer and the first barrier wall, the encapsulation layer comprises a first portion and a second portion, the first portion covers the organic functional layer, the second portion covers a side of the first barrier wall adjacent to the organic functional layer, and the first portion forms an obtuse angle with the second portion; and forming a first opening in a region surrounded by the first barrier wall.

At least one embodiment of the present disclosure provides a display device, and the display device comprises the above display substrate.

The display substrate, the manufacture method of the display substrate, and the display device of the present disclosure will be described below by several specific embodiments.

Figure 2A:
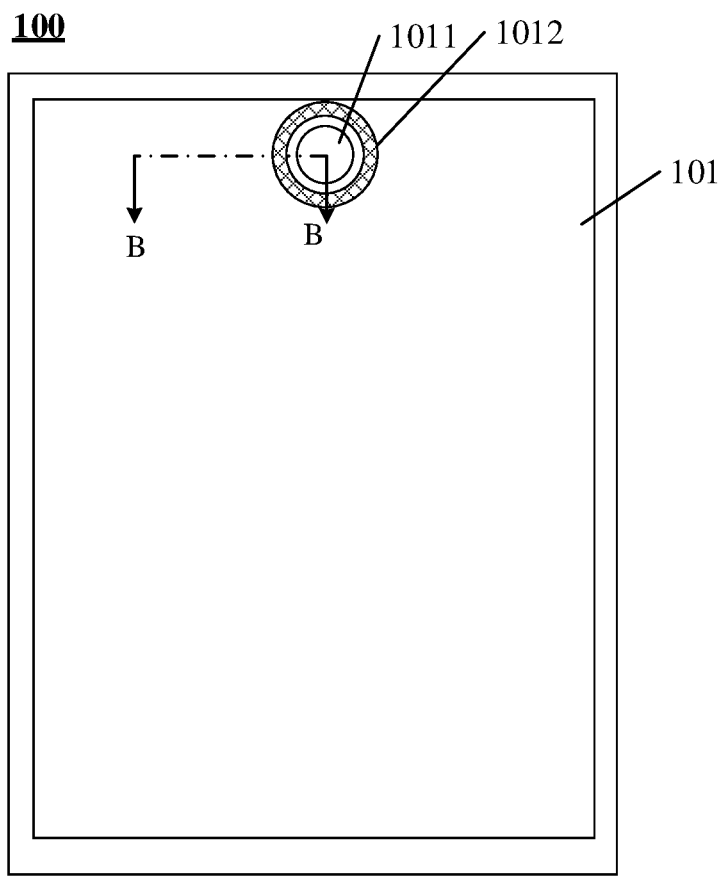
FIG. 2A is a schematic plane diagram of a display substrate provided by some embodiments of the present disclosure.
Figure 2B:
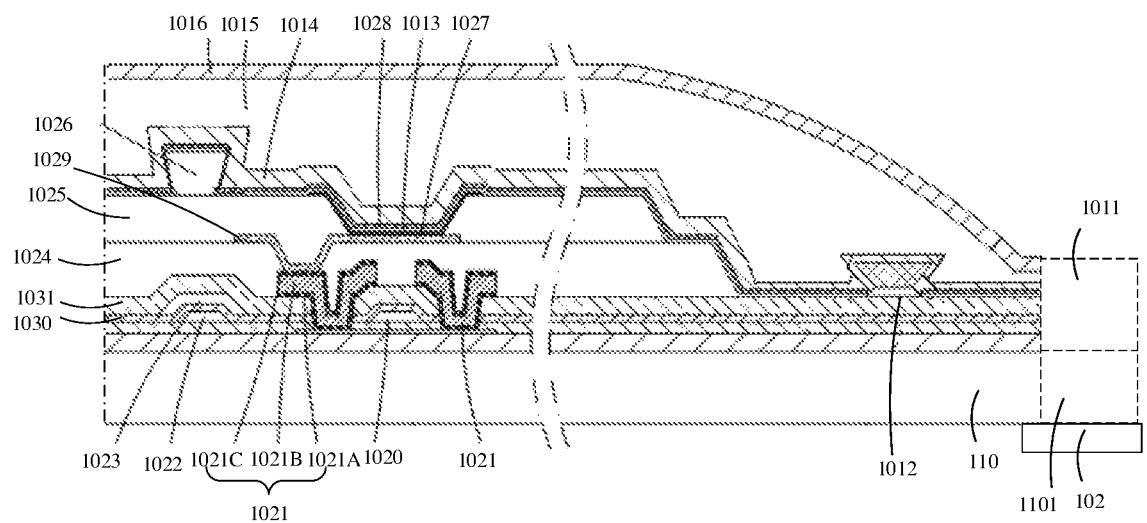
FIG. 2B is a schematic cross-sectional diagram of the display substrate shown in FIG. 2A along line B-B.
Figure 3:
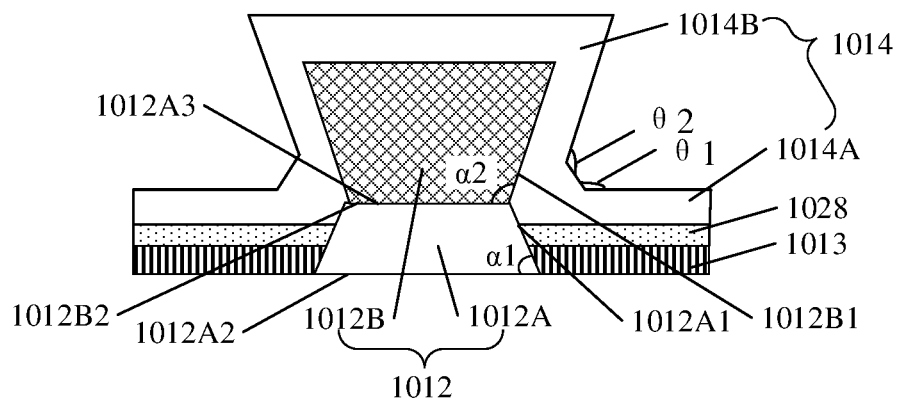
FIG. 3 is a schematic cross-sectional diagram of a barrier wall of a display substrate provided by some embodiments of the present disclosure.

At least one embodiment of the present disclosure provides a display substrate, FIG. 2A shows a schematic plane diagram of the display substrate, FIG. 2B shows a schematic cross-sectional diagram of the display substrate shown in FIG. 2A along line B-B, and FIG. 3 shows a partial cross-sectional schematic diagram of the display substrate comprising a first barrier wall.

As shown in FIG. 2A, FIG. 2B, and FIG. 3, a display substrate 100 comprises a display region 101, the display region 101 comprises a pixel array, and the pixel array comprises an organic functional layer 1013, an encapsulation layer 1014, and a first barrier wall 1012. The display region 101 has a first opening 1011, the first barrier wall 1012 surrounds an outer edge of the first opening 1011 (that is, the first barrier wall 1012 is disposed on a side of a circular edge of the first opening 1011 away from a center of the circular edge), the first opening 1011 is formed in the pixel array, and the organic functional layer 1013 at least partially or completely surrounds the first barrier wall 1012. The encapsulation layer 1014 covers the organic functional layer 1013 and the first barrier wall 1012 to provide a sealing function and a protection function to the organic functional layer 1013. As shown in FIG. 3, on both sides of the first barrier wall 1012, or on a side of the first barrier wall 1012 close to the first opening 1011, the encapsulation layer 1014 comprises a first portion 1014A and a second portion 1014B, the first portion 1014A covers a portion of the organic functional layer 1013 close to the first opening 1011, the second portion 1014B covers a side of the first barrier wall 1012 adjacent to the organic functional layer 1013, and the first portion 1014A forms an obtuse angle θ1 with the second portion 1014B.

In this embodiment, the first barrier wall 1012 can disconnect the organic functional layer 1013. For example, in some examples, a cathode layer 1028 is further formed on the organic functional layer 1013, for example, the organic functional layer 1013 and the cathode layer 1028 are also extended to be on the first barrier wall 1012 (referring to examples shown in FIG. 4 and FIG. 5), in this case, the first barrier wall 1012 can disconnect the organic functional layer 1013 and the cathode layer 1028, that is, the first barrier wall 1012 separates the organic functional layer 1013 and the cathode layer 1028 into a plurality of disconnected portions. For example, in a case where a portion of the organic functional layer 1013 and a portion of the cathode layer 1028, which are close to the first opening 1011, are contaminated, for example, are eroded by impurities such as water and oxygen, due to a barrier function of the first barrier wall 1012, the contamination does not diffuse or extend to a portion of the organic functional layer 1013 and a portion of the cathode layer 1028, which correspond to the pixel array and are configured for emitting light. In addition, because the encapsulation layer 1014 forms an obtuse angle structure at the side of the first barrier wall 1012 (at both sides or one side of the first barrier wall 1012), and therefore the encapsulation layer 1014 is less prone to cracking in a case where a force is applied to the encapsulation layer 1014 or during a subsequent processing, in other words, the encapsulation layer 1014 having the obtuse angle structure can withstand greater force than the encapsulation layer 1014 having an acute angle structure, so that the encapsulation layer 1014 is less likely to be damaged, which makes the encapsulation effect of the encapsulation layer 1014 better.

For example, in some embodiments of the present disclosure, a distance between the first barrier wall 1012 and the outer edge of the first opening 1011 is 50 μm-500 μm, such as 100 μm, 200 μm, 300 μm, 400 μm, or the like, so that a portion of the display region 201 close to the first opening 2011 has a sufficient encapsulation area covered by the encapsulation layer 1014, thereby ensuring the encapsulation effect.

For example, in some embodiments of the present disclosure, as shown in FIG. 3, the first barrier wall 1012 comprises a first barrier wall layer 1012A and a second barrier wall layer 1012B stacked on the first barrier wall layer 1012A. A first side 1012A1, which is covered by the encapsulation layer 1014, of the first barrier wall layer 1012A forms an acute angle α1 with a bottom surface 1012A2 of the first barrier wall layer 1012A; a second side 1012B1, which is covered by the encapsulation layer 1014, of the second barrier wall layer 1012B forms an obtuse angle α2 with a bottom surface 1012B2 of the second barrier wall layer 1012B.

For example, in some embodiments of the present disclosure, the second side 1012B1 of the second barrier wall layer 1012B terminates at a top surface 1012A3 of the first barrier wall layer 1012A, and therefore the first side 1012A1 of the first barrier wall layer 1012A and the second side 1012B1 of the second barrier wall layer 1012B intersect, or the first side 1012A1 of the first barrier wall layer 1012A and the second side 1012B1 of the second barrier wall layer 1012B are staggered from each other by a predetermined distance to form a step portion. For example, a case that the first side 1012A1 of the first barrier wall layer 1012A and the second side 1012B1 of the second barrier wall layer 1012B intersect is shown in FIG. 3, in this case, the second side 1012B1 of the second barrier wall layer 1012B terminates at an edge of the top surface 1012A3 of the first barrier wall 1012A. In a case where the second side 1012B1 of the second barrier wall layer 1012B terminates inside the top surface 1012A3 of the first barrier wall layer 1012A, the first side 1012A1 of the first barrier wall layer 1012A and the second side 1012B1 of the second barrier wall layer 1012B are staggered from each other, that is, do not intersect, thereby forming the step portion, and the step portion is advantageous to form the obtuse angle structure of the encapsulation layer described above, thereby providing a better encapsulation effect.

For example, in an example of this embodiment, a main cross-section of the first barrier wall layer 1012A as a whole is in a positive trapezoid shape, that is, a trapezoid shape in which a bottom edge is longer than a top edge; a main cross-section of the second barrier wall layer 1012B as a whole is in an inverted trapezoid shape, that is, a trapezoid shape in which a bottom edge is shorter than a top edge. Thus, a cross-section of the first barrier wall 1012 is in a "sandglass shape" on the whole. In this embodiment, the main cross-section of the first barrier wall layer 1012A and the main cross-section of the second barrier wall layer 1012B are respectively cross-sections that can reflect the overall shape designs of the first barrier wall layer 1012A and the second barrier wall layer 1012B. For example, in FIG. 2A, the main cross-section is obtained by cutting along a straight ling passing through a center of the first opening 1011 and along a direction perpendicular to a plane at which the display substrate is located.

Figure 4:
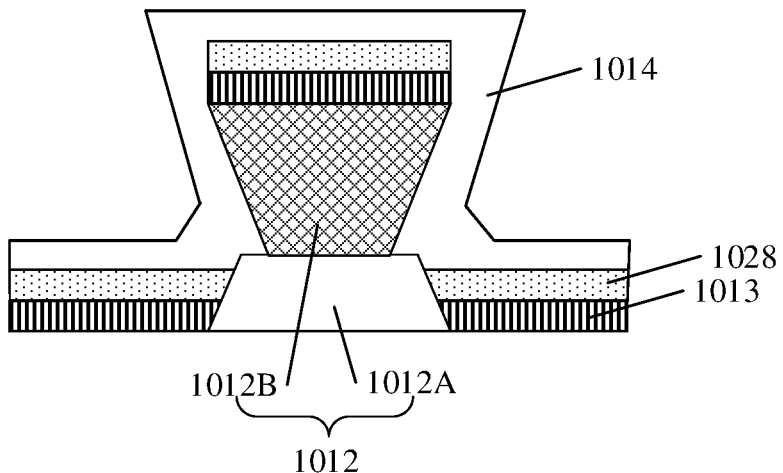
FIG. 4 is a schematic cross-sectional diagram of another barrier wall of a display substrate provided by some embodiments of the present disclosure.

For example, in this example, a width of a bottom edge 1012B2 of the inverted trapezoid shape presented by the main cross-section of the second barrier wall layer 1012B is less than or equal to a width of a top edge 1012A3 of the positive trapezoid shape presented by the main cross-section of the first barrier wall layer 1012A. For example, FIG. 3 shows a case that the width of the bottom edge 1012B2 of the inverted trapezoid shape presented by the main cross-section of the second barrier wall layer 1012B is equal to the width of the top edge 1012A3 of the positive trapezoid shape presented by the main cross-section of the first barrier wall layer 1012A, in this case, the first side 1012A1 of the first barrier wall layer 1012A and the second side 1012B1 of the second barrier wall layer 1012B intersect. FIG. 4 shows a case that the width of the bottom edge 1012B2 of the inverted trapezoid shape presented by the main cross-section of the second barrier wall layer 1012B is less than the width of the top edge 1012A3 of the positive trapezoid shape presented by the main cross-section of the first barrier wall layer 1012A, in this case, the first side 1012A1 of the first barrier wall layer 1012A and the second side 1012B1 of the second barrier wall layer 1012B are staggered from each other, that is, do not intersect.

Figure 5:
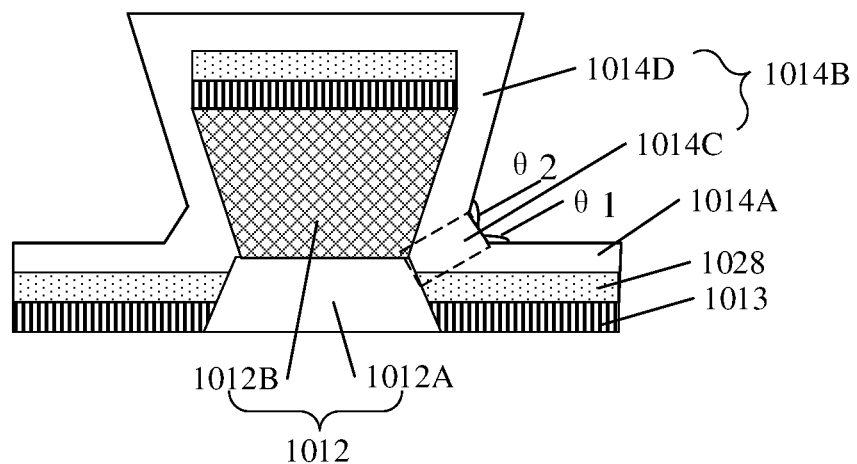
FIG. 5 is a schematic cross-sectional diagram of still another barrier wall of a display substrate provided by some embodiments of the present disclosure.

For example, in this embodiment, in conjunction with FIG. 5, because the first barrier wall 1012 comprises the first barrier wall layer 1012A and the second barrier wall layer 1012B, and a sum thickness of a thickness of the organic functional layer 1013 around the first barrier wall 1012 and a thickness of the cathode layer 1028 around the first barrier wall 1012 is lower than a thickness of the first barrier wall layer 1012A, the second portion 1014B of the encapsulation layer 1014 covering the side of the first barrier wall 1012 adjacent to the organic functional layer 1013 comprises a third portion 1014C covering the first barrier wall layer 1012A and a fourth portion 1014D covering the second barrier wall layer 1012B. For example, the first portion 1014A and the third portion 1014C of the encapsulation layer 1014 form a first obtuse angle θ1, and the third portion 1014C and the fourth portion 1014D form a second obtuse angle θ2. The encapsulation layer 1014 formed with the first obtuse angle θ1 and the second obtuse angle θ2 is less prone to cracking, in other words, the encapsulation layer 1014 formed with the first obtuse angle θ1 and the second obtuse angle θ2 can withstand greater force than the encapsulation layer 1014 formed with an acute angle structure, so that the encapsulation layer 1014 is less likely to be damaged, which makes the encapsulation effect of the encapsulation layer 1014 better.

For example, in some embodiments of the present disclosure, a material used to form the second barrier wall layer 1012B comprises a negative photoresist. For example, the negative photoresist comprises a phenolic resin. The negative photoresist is easier to form a structure of which the cross-section is in an inverted trapezoidal shape where exposure and development processes are performed to the negative photoresist.

For example, in some embodiments of the present disclosure, a material of the first barrier wall layer 1012A comprises a positive photoresist. The positive photoresist comprises, for example, a resin material such as polyimide (PI) or the like. The positive photoresist is easier to form a structure of which the cross-section is in a positive trapezoidal shape where exposure and development processes are performed to the positive photoresist.

In some embodiments of the present disclosure, each of the first barrier wall layer 1012A and the second barrier wall layer 1012B included in the first barrier wall 1012 comprises an organic material (resin), and therefore a bonding force between the first barrier wall layer 1012A and the second barrier wall layer 1012B is stronger and better than a bonding force between the first barrier wall layer 1012A and the second barrier wall layer 1012B which are formed by an organic material and an inorganic material, respectively, thereby being advantageous to prevent the diffusion of the impurities.

FIG. 2B shows a display circuit portion (a left side portion of the crosshatch in FIG. 2B) and a barrier wall portion (a right side portion of the crosshatch in FIG. 2B) of a pixel array included in a display region of a display substrate. For example, a display circuit portion of a pixel unit of the pixel array comprises a display component, the display component, for example, may be an organic light emitting component, and comprises an anode layer 1027, a cathode layer 1028, and an organic functional layer 1013 between the anode layer 1027 and the cathode layer 1028, for example, the cathode layer 1028 is a common cathode layer. The organic functional layer 1013 can emit light by applying voltages to the anode layer 1027 and the cathode layer 1028. For example, the display circuit portion also comprises a drive circuit that drives the display component to emit light, and the drive circuit comprises, for example, a thin film transistor, a storage capacitor, and the like. The thin film transistor comprises structures such as a gate electrode 1020, source-drain electrodes 1021, and the like. For example, each of the source-drain electrodes 1021 may comprise a multiplayer electrode structure, and for example, may comprise a three-layer electrode structure of titanium 1021A/aluminum 1021B/titanium 1021C. One of the source-drain electrodes 1021 is electrically connected to the anode layer 1027 of the display component through a pixel electrode 1029, thereby providing a driving signal to the display component. For example, the storage capacitor comprises a first electrode 1022, a second electrode 1023, and a first insulating layer 1030 between the first electrode 1022 and the second electrode 1023. For example, the drive circuit may be a 2T1C (that is, two thin film transistors and one storage capacitor) circuit, a 3T1C (that is, three thin film transistors and one storage capacitor) circuit, and the like.

For example, the display circuit portion also comprises a second insulating layer 1031 for insulation, a planarization layer 1024 for providing a planarization surface on the thin film transistor and the storage capacitor, a pixel defining layer 1025 for defining the display component, a columnar spacer 1026 for forming an encapsulation space with an opposite substrate (not shown), and other structures. For example, a material of the planarization layer 1024 and/or the pixel defining layer 1025 comprises a positive photoresist, in this case, the first barrier wall layer 1012A of the first barrier wall 1012 may be formed in the same layer as the planarization layer 1024 or the pixel defining layer 1025, that is, the first barrier wall layer 1012A and the planarization layer 1024 or the pixel defining layer 1025 may be formed by a single patterning process using the same film layer in a manufacture process. For example, a material of the columnar spacer 1026 comprises a negative photoresist, in this case, the second barrier wall layer 1012B of the first barrier wall 1012 may be formed in the same layer as the columnar spacer 1026, that is, the second barrier wall layer 1012B and the columnar spacer 1026 may be formed by a single patterning process using the same film layer in the manufacture process.

For example, in one example of the embodiment of the present disclosure, the first barrier wall 1012 is formed on a second insulating layer 1031. Because the cross-section of the first barrier wall layer 1012A included in the first barrier wall 1012 is in a positive trapezoid shape, a contact area between the bottom surface of the first barrier wall layer 1012A and the second insulating layer 1031 is relatively large, and therefore the adhesion between the first barrier wall layer 1012A and the second insulating layer 1031 can be improved. For example, in a case where a material of the second insulating layer 1031 comprises an inorganic material, and a material of the first barrier wall layer 1012A comprises an organic material, the adhesion between the inorganic material and the organic material may be weak, in this case, the main cross-section of the first barrier wall layer 1012A being in the positive trapezoid shape can significantly improve the adhesion between the first barrier wall layer 1012A and the second insulating layer 1031. In addition, both a material of the first barrier wall layer 1012A and a material of the second barrier wall layer 1012B may, for example, comprise the organic material, and the bonding force between the organic material and the organic material is strong, that is, the bonding force between the first barrier wall layer 1012A and the second barrier wall layer 1012B is relatively strong, so that the first barrier wall 1012 as a whole has a high adhesion on the display substrate.

For example, in some embodiments of the present disclosure, the encapsulation layer covering the display circuit portion and the barrier wall portion is a composite encapsulation layer, and the composite encapsulation layer comprises an inorganic encapsulation layer and an organic encapsulation layer which are stacked, or comprises a plurality of inorganic encapsulation layers and a plurality of organic encapsulation layers which are stacked alternately. For example, in addition to the encapsulation layer 1014 previously described, as shown in FIG. 2B, the composite encapsulation layer further comprises a second encapsulation layer 1015 and a third encapsulation layer 1016. For example, the encapsulation layer 1014 and the third encapsulation layer 1016 are made of inorganic materials, the organic materials comprise, for example, silicon nitride, silicon oxide, silicon oxynitride, or the like, and the second encapsulation layer 1015 is made of an organic material, the organic material comprises, for example, polyimide (PI), epoxy resin, or the like. For example, the encapsulation layer 1014 is formed along the outer wall of the first barrier wall 1012, the second encapsulation layer 1015 planarizes the encapsulation layer 1014, and the third encapsulation layer 1016 is formed as an external encapsulation. The composite encapsulation layer forms multiple protection for internal components of the display region and has a better encapsulation effect.

For example, in this embodiment, as shown in FIG. 2B, the display substrate 100 further comprises structures such as a base substrate 110, an image sensor 102, and the like, and may also comprise an infrared sensor or the like as needed. For example, the display region 101 is disposed on the base substrate 110, the base substrate 110 has a second opening 1101 connecting with the first opening 1011, the image sensor 102 is connected to the base substrate 110 (for example, is connected to a non-display side of the base substrate 110), and an orthographic projection of the image sensor 102 on the base substrate 110 at least partially overlaps with the second opening 1101, so that the image sensor 102 can acquire images through the first opening 1011 and the second opening 1101 and achieve various functions such as photographing, face recognition, and so on. For example, the image sensor 102 may comprise a sensor of any form such as a CCD image sensor, a COMS image sensor, a CIS image sensor, and so on, and the embodiments of the present disclosure are not limited in this aspect. For example, the infrared sensor is also connected to the non-display side (not shown) of the base substrate 110, and performs infrared sensing or the like through the first opening 1011 and the second opening 1101.

For example, in some embodiments of the present disclosure, the first opening 1011 and/or the second opening 1101 are filled with a transparent medium. The transparent medium comprises, for example, a material such as a resin having a high light transmittance.

For example, in the embodiment of the present disclosure, the first opening 1011 in the display region 101 is completely surrounded by a portion of the display region 101 except the first opening 1011, so that an image can be displayed in the portion of the display region 101 except the first opening 1011, thereby maximizing the display region.

Figure 6A:
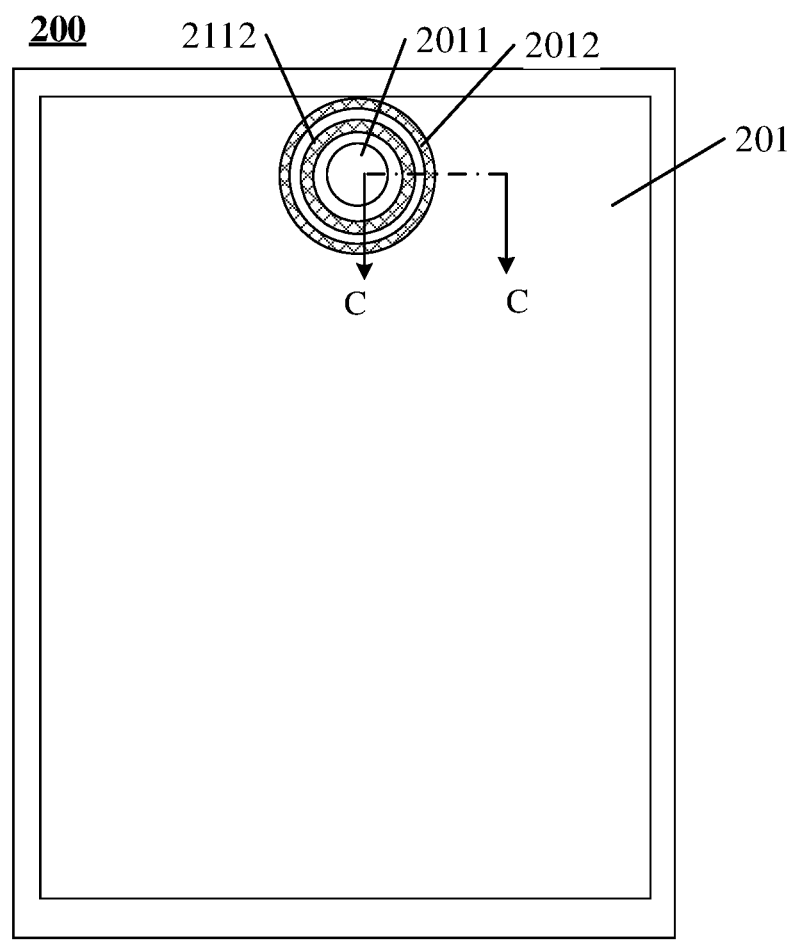
FIG. 6A is a schematic plane diagram of another display substrate provided by some embodiments of the present disclosure.

For example, in other embodiments of the present disclosure, the display region of the display substrate further comprises a second barrier wall. For example, the second barrier wall is disposed on a side of the first barrier wall away from the first opening, and the second barrier wall is disposed around the first opening. FIG. 6A is a schematic plane diagram of a display substrate provided by the embodiment; and FIG. 6B is a schematic cross-sectional diagram of the display substrate shown in FIG. 6A along line C-C.

Figure 6B:
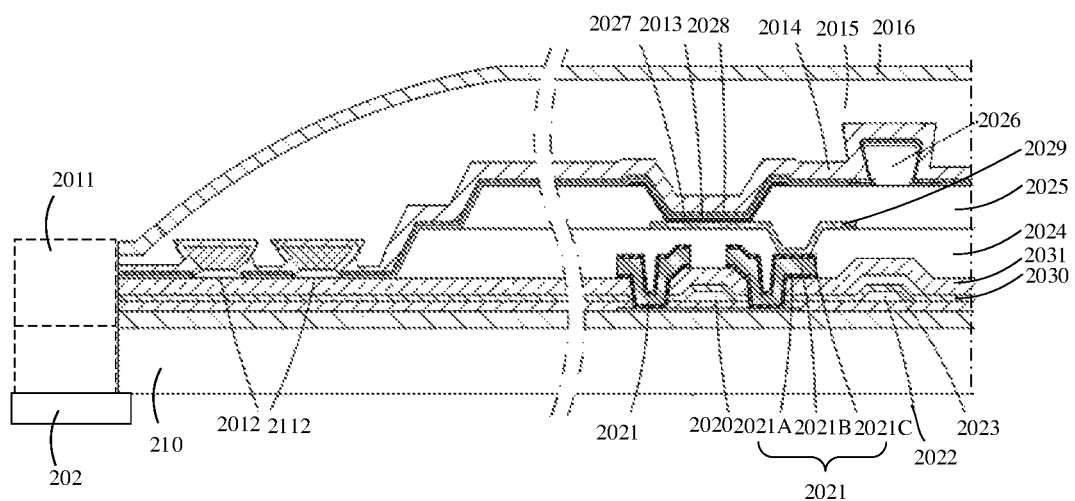
FIG. 6B is a schematic cross-sectional diagram of the display substrate shown in FIG. 6A along line C-C.

As shown in FIG. 6A and FIG. 6B, a display substrate 200 comprises a display region 201, the display region 201 comprises a pixel array, and the pixel array comprises an organic functional layer 2013, an encapsulation layer 2014, a first barrier wall 2012, and a second barrier wall 2112. The display region 201 has a first opening 2011, the first barrier wall 2012 surrounds an outer edge of the first opening 2011 (that is, the first barrier wall 2012 is disposed on a side of a circular edge of the first opening 2011 away from a center of the circular edge), and the second barrier wall 2112 is disposed on a side of the first barrier wall 2012 away from the first opening 2011. The organic functional layer 2013 surrounds the first barrier wall 2012 and the second barrier wall 2112. The encapsulation layer 1014 covers the organic functional layer 2013, the first barrier wall 2012, and the second barrier wall 2112.

For example, the second barrier wall 2112 has substantially the same structure as the first barrier wall 2012, and the specific structure of the second barrier wall 2112 can refer to the above embodiments, and details are not described herein again.

In this embodiment, two barrier walls are disposed on the periphery of the first opening 2011 in the display region 201, so that the barrier effect of the barrier walls and the encapsulation effect of the encapsulation layer 2014 can be further improved. For example, in other embodiments of the present disclosure, a plurality of barrier walls, for example, three barrier walls, four barrier walls, five barrier walls, or the like, may be disposed on the periphery of the first opening 2011 in the display region 201. The setting of the barrier walls may be selected according to the specific needs of the application environment of the display substrate, and the embodiments of the present disclosure are not limited thereto.

For example, FIG. 6B shows a display circuit portion (a right side portion of the crosshatch in FIG. 6B) and a barrier wall portion (a left side portion of the crosshatch in FIG. 6B) of a pixel array included in a display region of a display substrate. For example, a display circuit portion of a pixel unit comprises a display component, the display component, for example, may be an organic light emitting component, and comprises an anode layer 2027, a cathode layer 2028, and an organic functional layer 2013 between the anode layer 2027 and the cathode layer 2028, for example, the cathode layer 2028 is a common cathode layer. For example, the display circuit portion also comprises a drive circuit that drives the display component to emit light, and the drive circuit comprises, for example, a thin film transistor, a storage capacitor, and the like. The thin film transistor comprises structures such as a gate electrode 2020, source-drain electrodes 2021, and the like. For example, each of the source-drain electrodes 2021 may comprise a multiplayer electrode structure, and for example, may comprise a three-layer electrode structure of titanium 2021A/aluminum 2021B/titanium 2021C. One of the source-drain electrodes 2021 is electrically connected to the anode layer 2027 of the display component through a pixel electrode 2029, thereby providing a driving signal to the display component. For example, the storage capacitor comprises a first electrode 2022, a second electrode 2023, and a first insulating layer 2030 between the first electrode 2022 and the second electrode 2023.

For example, the display circuit portion also comprises a second insulating layer 2031 for insulation, a planarization layer 2024 for providing a planarization surface on the thin film transistor, a pixel defining layer 2025 for defining the display component, a columnar spacer 2026 for forming an encapsulation space with an opposite substrate (not shown), and other structures. For example, a material of the planarization layer 2024 and/or the pixel defining layer 2025 comprises a positive photoresist, in this case, a first barrier wall layer of the second barrier wall 2112 and a first barrier wall layer of the first barrier wall 2012 may be formed in the same layer as the planarization layer 2024 or the pixel defining layer 2025, that is, the first barrier wall layer of the second barrier wall 2112, the first barrier wall layer of the first barrier wall 2012, and the planarization layer 2024 or the pixel defining layer 2025 may be formed by a single patterning process using the same film layer in a manufacture process. For example, a material of the columnar spacer 2026 comprises a negative photoresist, in this case, a second barrier wall layer of the second barrier wall 2112 and a second barrier wall layer of the first barrier wall 2012 may be formed in the same layer as the columnar spacer 1026, that is, the second barrier wall layer of the second barrier wall 2112, the second barrier wall layer of the first barrier wall 2012, and the columnar spacer 1026 may be formed by a single patterning process using the same film layer in the manufacture process.

For example, in an example, the first barrier wall 2012 and the second barrier wall 2112 are formed on a second insulating layer 2031. Because a cross-section of the first barrier wall layer included in the first barrier wall 1012 and a cross-section of the first barrier wall layer included in the second barrier wall 2112 are in positive trapezoid shapes, a contact area between a bottom surface of each first barrier wall layer and the second insulating layer 2031 is relatively large, and therefore the adhesion between each first barrier wall layer and the second insulating layer 1031 can be improved. For example, in a case where a material of the second insulating layer 2031 comprises an inorganic material, and a material of each first barrier wall layer comprises an organic material, the adhesion between the inorganic material and the organic material may be weak, in this case, the main cross-section of each first barrier wall layer being in the positive trapezoid shape can significantly improve the adhesion between each first barrier wall layer and the second insulating layer 2031. In addition, both a material of each first barrier wall layer and a material of the second barrier wall layer may, for example, comprise the organic materials, and the bonding force between the organic material and the organic material is strong, that is, the bonding force between each first barrier wall layer and the second barrier wall layer is relatively strong, so that each of the first barrier wall 2012 and the second barrier wall 2112 has a high adhesion on the display substrate as a whole.

For example, the encapsulation layer covering the display circuit portion and the barrier wall portion is a composite encapsulation layer, and the composite encapsulation layer comprises an inorganic encapsulation layer and an organic encapsulation layer which are stacked, or comprises a plurality of inorganic encapsulation layers and a plurality of organic encapsulation layers which are stacked alternately. For example, in addition to the encapsulation layer 2014 previously described, the composite encapsulation layer further comprises a second encapsulation layer 2015 and a third encapsulation layer 2016. For example, the encapsulation layer 2014 and the third encapsulation layer 2016 are made of inorganic materials, and the organic materials comprise, for example, silicon nitride, silicon oxide, silicon oxynitride, or the like. The second encapsulation layer 2015 is made of an organic material, and the organic material comprises, for example, polyimide (PI), epoxy resin, or the like. For example, the encapsulation layer 2014 is formed along the outer wall of the first barrier wall 2012 and the outer wall of the second barrier wall 2112, the second encapsulation layer 1015 planarizes the encapsulation layer 2014, and the third encapsulation layer 2016 is formed as an external encapsulation. The composite encapsulation layer forms multiple protection for internal components of the display region and has a better encapsulation effect.

For example, in this embodiment, the display substrate 300 further comprises structures such as a base substrate 210, an image sensor 202, and the like, and specific forms and setting manners of these structures can refer to the above embodiments, and details are not described herein again.

For example, in the embodiments shown in FIG. 2B and FIG. 6B, the shown thin film transistor is a top-gate type thin film transistor, however, the embodiments of the present disclosure are not limited thereto, for example, the thin film transistor may also be a bottom-gate type thin film transistor. For example, the drive circuit may comprise a plurality of thin film transistors, and these thin film transistors may be top-gate type thin film transistors or bottom-gate type thin film transistors, and may be N-type thin film transistors or P-type thin film transistors, the embodiments of the present disclosure are not limited in this aspect.

In the embodiments of the present disclosure, the organic light emitting diode may be of a tope emission type, a bottom emission type, or a double-sided emission type, and the organic functional layer of the organic light emitting diode may comprise a light emitting layer or a composite layer including a light emitting layer, and the composite layer comprises an electron injection layer, an electron transport layer, the light emitting layer, a hole transport layer, a hole injection layer which are sequentially stacked. The embodiments of the present disclosure do not limit the structure and the type of the organic light emitting diode.

At least one embodiment of the present disclosure provides a manufacture method of a display substrate, and the manufacture method comprises: forming a display region, which comprises forming a first barrier wall, an organic functional layer, and an encapsulation layer. The organic functional layer surrounds the first barrier wall, the encapsulation layer covers the organic functional layer and the first barrier wall, the encapsulation layer comprises a first portion and a second portion, the first portion is configured to cover the organic functional layer, the second portion is configured to cover a side of the first barrier wall adjacent to the organic functional layer, and the first portion of the encapsulation layer forms an obtuse angle with the second portion of the encapsulation layer. Then, forming a first opening in a region surrounded by the first barrier wall.

For example, while forming the first barrier wall, a second barrier wall may be formed on a side of the first barrier wall away from the first opening, thereby forming two barrier walls surrounding the first opening to improve the barrier effect.

Hereinafter, the manufacture method of the embodiments of the present disclosure will be described in detail by taking a case of forming two barrier walls as an example.

Figure 7A:
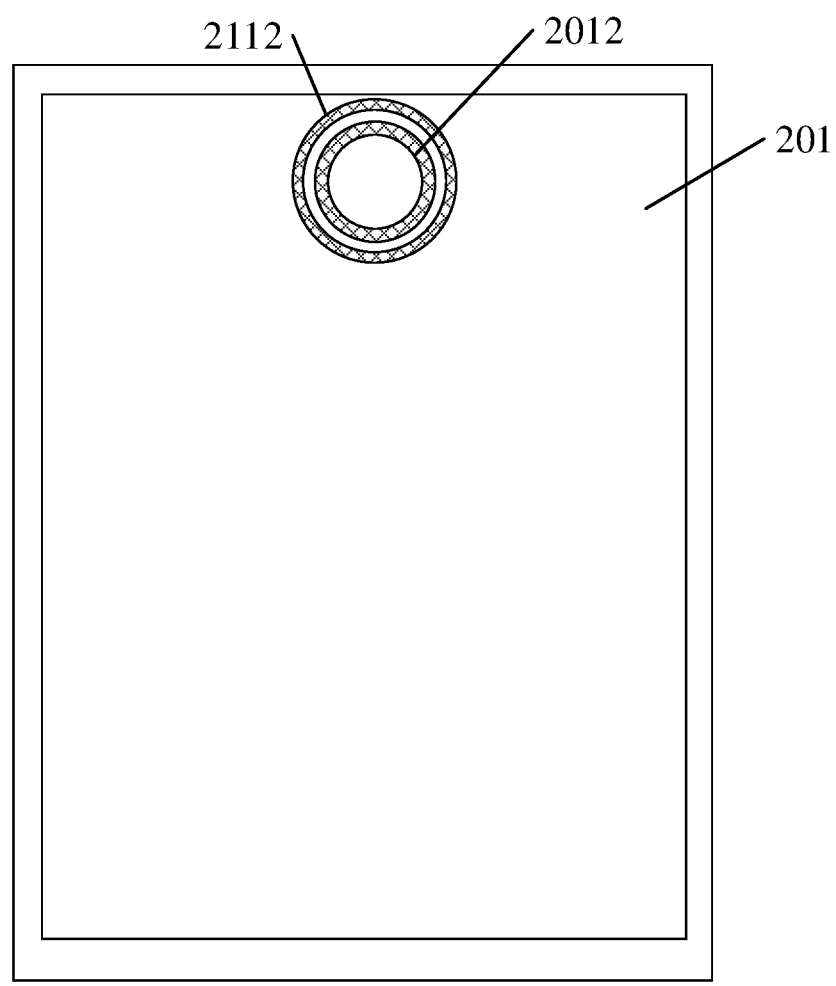
FIGS. 7A and 7B are schematic plane diagrams of a display substrate in a manufacture process provided by some embodiments of the present disclosure.
Figure 8A:
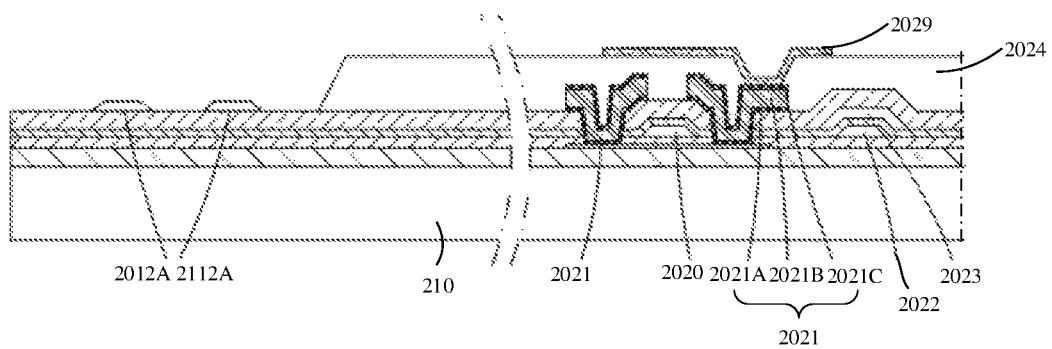
FIGS. 8A-8C are schematic cross-sectional diagrams of a display substrate in a manufacture process provided by some embodiments of the present disclosure.
Figure 8B:
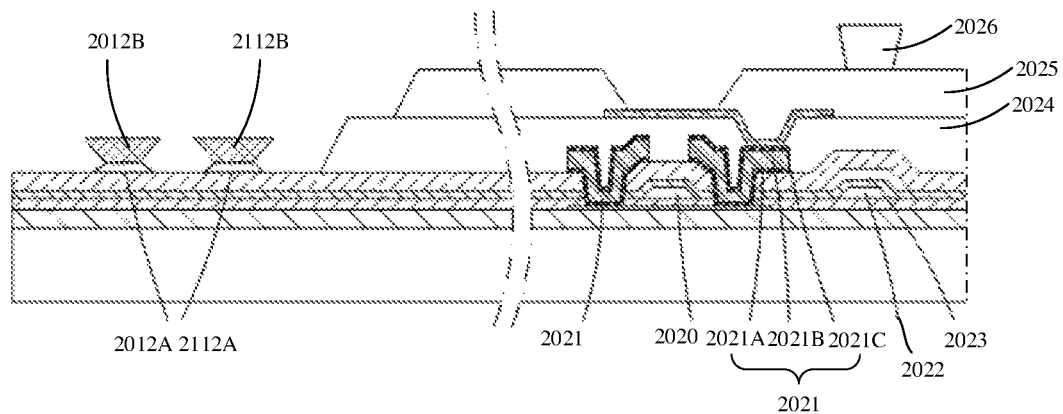
Figure 8C:
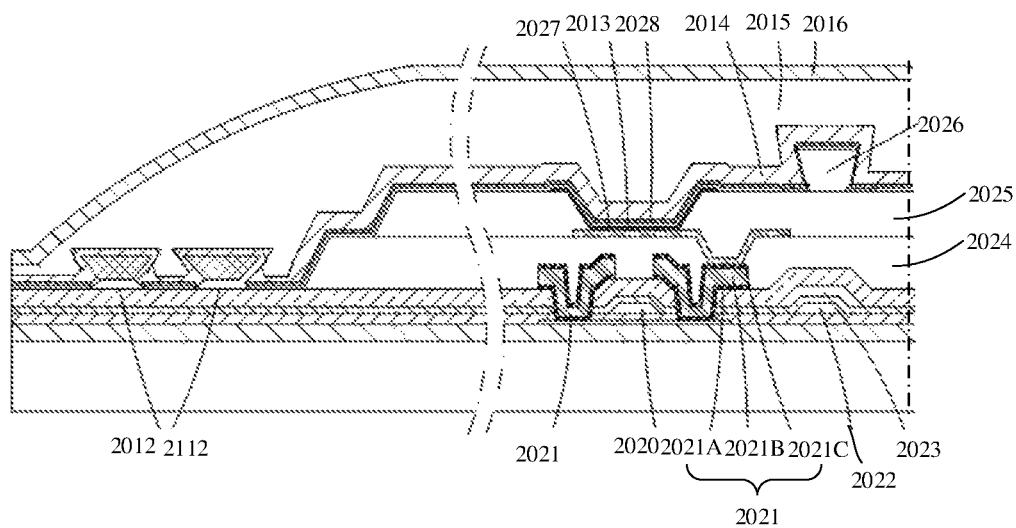

For example, as shown in FIG. 7A, a display region 201 is formed first. As shown in FIG. 8A-FIG. 8C, forming the display region comprises forming a first barrier wall 2012, a second barrier wall 2112, an organic functional layer 2013, an encapsulation layer 2014, and so on.

As shown in FIG. 8A, first, a drive circuit layer is formed on a base substrate 210, and forming the drive circuit layer comprises forming structures such as a thin film transistor, a storage capacitor, and the like. For example, film layers of the structures, such as the thin film transistor, the storage capacitor, and the like, are sequentially formed on the base substrate 210 by patterning processes. For example, one patterning process comprises processes such as photoresist formation, exposure, development, etching and so on.

For example, a gate electrode 2020 of the thin film transistor and a first electrode 2022 of the storage capacitor are formed by a single patterning process using the same film layer, thereby simplifying the manufacture process. For example, the gate electrode 2020 of the thin film transistor and the first electrode 2022 of the storage capacitor comprise a metal material, such as aluminum, titanium, cobalt, or the like, or comprise an alloy material. During the manufacturing process, first, a gate material layer is formed by a sputtering method, an evaporation method, or the like, and then the gate material layer is patterned to form the gate electrode 2020 of a certain pattern and the first electrode 2022 of the storage capacitor of a certain pattern.

For example, source-drain electrodes 2021 of the thin film transistor may be formed as a multiplayer electrode structure. For example, a titanium material layer, an aluminum material layer, and a titanium material layer are sequentially formed by a sputtering method, an evaporation method, or the like, and then the three material layers are patterned by a single patterning process to form a three-layer electrode structure of titanium 2021A/aluminum 2021B/titanium 2021C.

For example, after the formation of the film layers of the thin film transistor and the storage capacitor is completed, a planarization layer 2024 is formed. For example, the planarization layer 2024, a first barrier wall layer 2012A of the first barrier wall 2012, and a first barrier wall layer 2112A of the second barrier wall 2112 all are formed of positive photoresist materials. For example, the planarization layer 2024, the first barrier wall layer 2012A of the first barrier wall 2012, and the first barrier wall layer 2112A of the second barrier wall 2112 are formed by a single patterning process using the same film layer, thereby simplifying the manufacture process.

For example, forming the planarization layer 2024, the first barrier wall layer 2012A, and the first barrier wall layer 2112A comprises: forming a positive photoresist material layer, and exposing and developing the positive photoresist material layer to form the first barrier wall layer 2012A and the first barrier wall layer 2112A and to form the planarization layer 2024 and a via hole in the planarization layer 2024 at the same time, so that the pixel electrode formed later is connected to one of the source-drain electrodes 2021 through the via hole.

As shown in FIG. 8B, a pixel defining layer 2025 and a columnar spacer 2026 are formed on the planarization layer 2024.

For example, the columnar spacer 2026, a second barrier wall layer 2012B of the first barrier wall 2012, and a second barrier wall layer 2112B of the second barrier wall 2112 all are formed of negative photoresist materials. For example, the columnar spacer 2026, the second barrier wall layer 2012B of the first barrier wall 2012, and the second barrier wall layer 2112B of the second barrier wall 2112 are formed by a single patterning process using the same film layer, thereby simplifying the manufacture process.

For example, forming the columnar spacer 2026, the second barrier wall layer 2012B, and the second barrier wall layer 2112B comprises: forming a negative photoresist material layer on the first barrier wall layer 2012A, the first barrier wall layer 2112A, and the pixel defining layer 2025, and exposing and developing the negative photoresist material layer to form the second barrier wall layer 2012B and the second barrier wall layer 2112B and to form the columnar spacer 2026 at the same time, and the columnar spacer 2026 can form an encapsulation space, thereby facilitating subsequent formation of the encapsulation layer.

As shown in FIG. 8C, a display component is formed in the pixel defining layer 2025, and forming the display component comprises forming an anode layer 2027, an organic functional layer 2013, and a cathode layer 2028. For example, the cathode layer 2028 is a common cathode layer. For example, the organic functional layer 2013 and the cathode layer 2028 are respectively formed into entire surfaces by an evaporation method, a deposition method, an inkjet method, or the like, in this case, the first barrier wall 2012 and the second barrier wall 2112 can disconnect the organic functional layer 2013 and the cathode layer 2028, that is, the organic functional layer 2013 and the cathode layer 2028 are separated into disconnected portions at positions close to the opening 2011, so as to prevent the organic functional layer 2013 and the cathode layer 2028 at different positions from interfering with each other. For example, in a case where a portion of the organic functional layer 2013 close to the first opening 2011 and a portion of the cathode layer 2028 close to the first opening 2011 are contaminated, due to the barrier function of the first barrier wall 1012 and the second barrier wall 2112, the impurities do not diffuse and extend to a portion of the organic functional layer 2013 and a portion of the cathode layer 2028, which are configured for emitting light. For example, the organic functional layer 2013 and the cathode layer 2028 are also formed on the first barrier wall 2012 and the second barrier wall 2112, which is not shown in figures.

For example, an encapsulation layer 2014 may be formed by a chemical vapor deposition method, or the like. In this case, the encapsulation layer 2014 is formed along outer walls of the first barrier wall 2012 and the second barrier wall 2112, and a portion of the encapsulation layer 2014 covering the first barrier wall 2012 and a portion of the encapsulation layer 2014 covering the second barrier wall 2112 may form an obtuse angle structure, the obtuse angle structure is less prone to cracking, so that the encapsulation layer 1014 has a better encapsulation effect.

For example, a second encapsulation layer 2015 and a third encapsulation layer 2016 are further formed on the encapsulation layer 2014. The second encapsulation layer 2015 may planarize the encapsulation layer 2014, and the third encapsulation layer 2016 may be formed as an external encapsulation. For example, the encapsulation layer 2014 and the third encapsulation layer 2016 are made of organic materials, such as silicon nitride, silicon oxide, silicon oxynitride, or the like, and the second encapsulation layer 2015 is made of an organic material, the organic material comprises, for example, polyimide (PI), epoxy resin, or the like. Therefore, the encapsulation layer 2014, the second encapsulation layer 2015, and the third encapsulation layer 2016 are formed as a composite encapsulation layer, and the composite encapsulation layer achieve multiple protection for internal components of the display region 201 and has a better encapsulation effect.

In the embodiments of the present disclosure, other necessary film layers may be formed in the display region 201 as needed, and these film layers may be formed by a conventional method, and details are not described herein again.

Figure 7B:
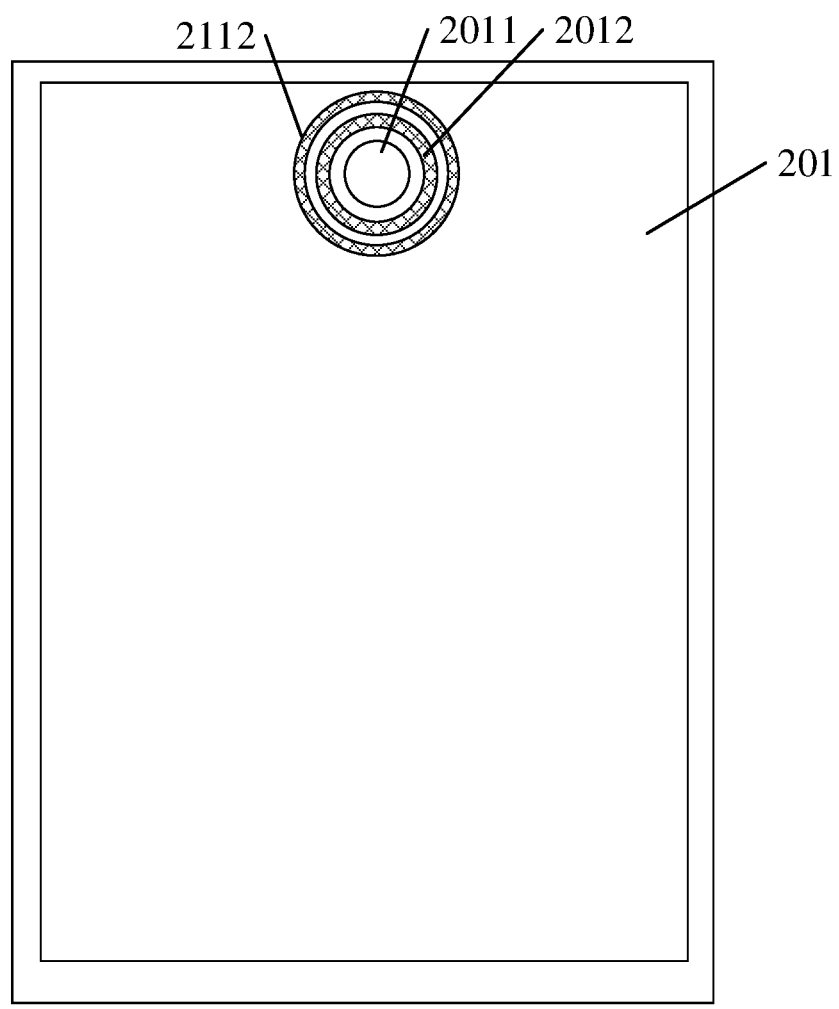

For example, as shown in FIG. 7B, after the functional structures in the display region 201 are formed, an opening may be formed in a region surrounded by the first barrier wall, the opening penetrates through the base substrate 210 and the display region 201 on the base substrate 210, thereby forming a first opening 2011 in the display region 201 and a second opening which is connected with the first opening 2011 in the base substrate 210. In some embodiments, a transparent medium material may be filled in the first opening 2011 in the display region 201 and in the second opening which is connected with the first opening 2011 in the base substrate 210 as needed, thereby obtaining a planarization surface and avoiding generating dust or the like.

For example, a distance between the first opening 2011 and the first barrier wall 1012 may be 50 μm-500 μm, such as, 100 μm, 200 μm, 300 μm, 400 μm, or the like, thereby reserving a sufficient encapsulation area for a portion of the display region 201 close to the first opening 2011.

For example, in this embodiment, the first opening 2011 may be formed by a laser cutting method, a mechanical stamping method, or the like. Structures such as an image sensor, an infrared sensor, or the like can be, for example, disposed at a position of the first opening. For example, the structures such as the image sensor, the infrared sensor, or the like may be disposed on a side of the base substrate 210 away from the display component (that is, a non-display side of the display substrate), and achieve a plurality of functions, such as photographing, face recognition, infrared sensing, and the like, through the first opening 2011.

Figure 9:
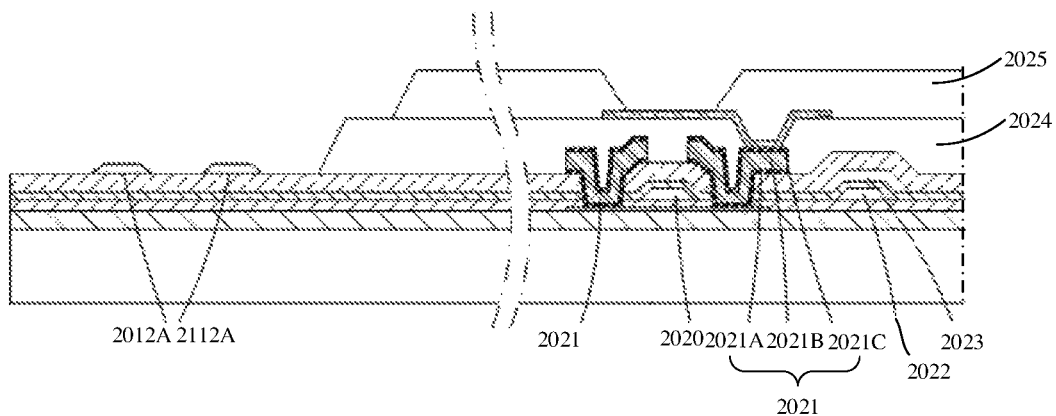
FIG. 9 is a schematic cross-sectional diagram of another display substrate in a manufacture process provided by some embodiments of the present disclosure.

In other examples of this embodiment, a forming material of the pixel defining layer 2025 in the display region 201 comprises, for example, a positive photoresist, in this case, as shown in FIG. 9, the first barrier wall layer 2012A of the first barrier wall 2012, the first barrier wall layer 2112A of the second barrier wall 2112, and the pixel defining layer 2025 may be formed by a single patterning process using the same film layer, thereby simplifying the manufacture process.

The first barrier wall 2012 and the second barrier wall 2112 formed by the manufacture method provided by this embodiment have "sandglass shape" structures, and the barrier walls having the "sandglass shape" structures may be formed in the same patterning processes as some functional film layers in the display region 201, so that the process steps of the display substrate are not increased. In addition, the barrier walls having the "sandglass shape" structures can have a better barrier effect, and allow an obtuse angle structure to be formed in the encapsulation formed later, which can improve the encapsulation effect of the encapsulation layer. In addition, the display substrate formed by the manufacture method provided by this embodiment, the region of the display region except the first opening can display, so as to maximize the display region and achieve a narrow border of the display device.

Figure 10:
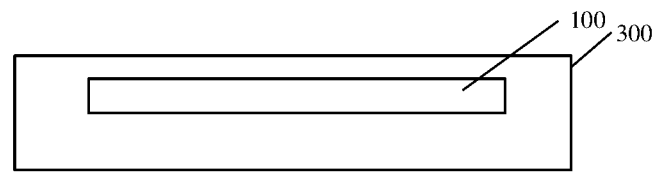
FIG. 10 is a schematic diagram of a display device provided by some embodiments of the present disclosure.

At least one embodiment of the present disclosure further provides a display device, as shown in FIG. 10, the display device 300 comprises any one of the display substrates provided by the embodiments of the present disclosure, and for example, the display device 300 comprises the display substrate 100. The display substrate of the display device can achieve a large screen, a full screen, and a narrow border, thereby having a better display effect.

For example, the display device 300 may be any product or component having a display function, and for example, may comprise a mobile phone, a tablet, a television, a monitor, a notebook computer, a digital photo frame, a navigator, an electronic advertisement screen, and the like, and the embodiments of the present disclosure are not limited thereto.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness a layer or area may be enlarged or narrowed, that is, the drawings are not drawn in a real scale. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

What is claimed is:

1. A display substrate, comprising a display region, wherein the display region comprises an organic functional layer, an encapsulation layer, and a first barrier wall;
    the display region has a first opening, the first barrier wall surrounds an outer edge of the first opening, the organic functional layer surrounds the first barrier wall, and the encapsulation layer covers the organic functional layer and the first barrier wall;
    the encapsulation layer comprises:
        a first portion, configured to cover a portion of the organic functional layer, wherein the portion is on a side of the first barrier wall close to the first opening; and
        a second portion, configured to cover a side of the first barrier wall adjacent to the organic functional layer, wherein the first portion forms an obtuse angle with the second portion;
    the first barrier wall comprises a first barrier wall layer and a second barrier wall layer stacked on the first barrier wall layer;
    a first side, which is covered by the encapsulation layer, of the first barrier wall layer forms an acute angle with a bottom surface of the first barrier wall layer; and
    a second side, which is covered by the encapsulation layer, of the second barrier wall layer forms an obtuse angle with a bottom surface of the second barrier wall layer.

2. The display substrate according to claim 1, wherein the second side of the second barrier wall layer terminates at a top surface of the first barrier wall layer, so that the first side of the first barrier wall layer and the second side of the second barrier wall layer intersect or are staggered from each other.

3. The display substrate according to claim 1, wherein a main cross-section of the first barrier wall layer as a whole is in a positive trapezoid shape; and a main cross-section of the second barrier wall layer as a whole is in an inverted trapezoid shape.

4. The display substrate according to claim 3, wherein a width of a bottom edge of the inverted trapezoid shape is less than or equal to a width of a top edge of the positive trapezoid shape.

5. The display substrate according to claim 3, wherein the second portion of the encapsulation layer comprises:
    a third portion of the encapsulation layer covering the first barrier wall layer, and
    a fourth portion of the encapsulation layer covering the second barrier wall layer;
    the first portion forms a first obtuse angle with the third portion, and the third portion forms a second obtuse angle with the fourth portion.

6. The display substrate according to claim 3, wherein a material of the second barrier wall layer comprises a negative photoresist.

7. The display substrate according to claim 6, wherein the negative photoresist comprises a phenolic resin.

8. The display substrate according to claim 3, wherein a material of the first barrier wall layer comprises a positive photoresist.

9. The display substrate according to claim 1, wherein the display region further comprises:
    a second barrier wall disposed on a side of the first barrier wall away from the first opening and surrounding the first opening.

10. The display substrate according to claim 1, further comprising:
    a base substrate, the display region being on the base substrate, wherein the base substrate has a second opening that is connected with the first opening, and
    an image sensor connected to the base substrate, wherein an orthographic projection of the image sensor on the base substrate at least partially overlaps with the second opening.

11. The display substrate according to claim 10, wherein the first opening and/or the second opening are filled with a transparent medium.

12. The display substrate according to claim 1, wherein the encapsulation layer is a composite encapsulation layer comprising an inorganic encapsulation layer and an organic encapsulation layer, the inorganic encapsulation layer and the organic encapsulation layer being stacked with each other.

13. A manufacture method of a display substrate, comprising:
forming a display region, which comprises forming a first barrier wall, an organic functional layer, and an encapsulation layer, wherein the organic functional layer surrounds the first barrier wall, the encapsulation layer covers the organic functional layer and the first barrier wall, the encapsulation layer comprises a first portion and a second portion, the first portion is configured to cover the organic functional layer, the second portion is configured to cover a side of the first barrier wall adjacent to the organic functional layer, the first portion forms an obtuse angle with the second portion; and
forming a first opening in a region surrounded by the first barrier wall;
the first barrier wall comprises a first barrier wall layer and a second barrier wall layer stacked on the first barrier wall layer;
a first side, which is covered by the encapsulation layer, of the first barrier wall layer forms an acute angle with a bottom surface of the first barrier wall layer; and
a second side, which is covered by the encapsulation layer, of the second barrier wall layer forms an obtuse angle with a bottom surface of the second barrier wall layer.

14. The manufacture method according to claim 13, wherein the first opening is formed by a laser cutting method or a mechanical stamping method.

15. The manufacture method according to claim 13, wherein forming the first barrier wall comprises:
forming a positive photoresist material layer, and exposing and developing the positive photoresist material layer to form a first barrier wall layer; and
forming a negative photoresist material layer on the first barrier wall layer, and exposing and developing the negative photoresist material layer to form a second barrier wall layer.

16. The manufacture method according to claim 15, further comprising: forming a pixel defining layer,
wherein the first barrier wall layer and the pixel defining layer are formed by a single patterning process.

17. The manufacture method according to claim 15, further comprising: forming a drive circuit layer and a planarization layer on the drive circuit layer,
wherein the first barrier wall layer and the planarization layer are formed by a single patterning process.

18. The manufacture method according to claim 15, further comprising: forming a columnar spacer,
wherein the second barrier wall layer and the columnar spacer are formed by a single patterning process.

19. A display device, comprising a display substrate according to claim 1.

* * * * *